(12) United States Patent
Hashimoto et al.

(10) Patent No.: US 9,018,722 B2
(45) Date of Patent: Apr. 28, 2015

(54) METHOD FOR MANUFACTURING SOLID-STATE IMAGE PICKUP DEVICE

(71) Applicant: Canon Kabushiki Kaisha, Tokyo (JP)

(72) Inventors: Kouhei Hashimoto, Kawasaki (JP); Masatsugu Itahashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/018,679

(22) Filed: Sep. 5, 2013

(65) Prior Publication Data

US 2014/0008748 A1 Jan. 9, 2014

Related U.S. Application Data

(63) Continuation of application No. 13/473,433, filed on May 16, 2012, now Pat. No. 8,551,801.

(30) Foreign Application Priority Data

May 27, 2011 (JP) .................................. 2011-119259

(51) Int. Cl.
| | |
|---|---|
| H01L 31/00 | (2006.01) |
| H01L 31/0232 | (2014.01) |
| H01L 31/02 | (2006.01) |
| H01L 31/18 | (2006.01) |
| H01L 27/146 | (2006.01) |

(52) U.S. Cl.
CPC ............... *H01L 31/02* (2013.01); *H01L 31/18* (2013.01); *H01L 27/14623* (2013.01); *H01L 27/14674* (2013.01)

(58) Field of Classification Search
CPC ................................ H01L 31/02; H01L 31/18
USPC .................................................... 257/431, 435
See application file for complete search history.

(56) References Cited

U.S. PATENT DOCUMENTS

| | | | | |
|---|---|---|---|---|
| 8,648,939 | B2 * | 2/2014 | Okuno ........................... | 348/246 |
| 2010/0330723 | A1 * | 12/2010 | Okabe et al. ................... | 438/59 |
| 2011/0242390 | A1 * | 10/2011 | Sogoh et al. ................... | 348/311 |

FOREIGN PATENT DOCUMENTS

| | | |
|---|---|---|
| CN | 1652343 A | 8/2005 |
| CN | 1812110 A | 8/2006 |
| JP | 05-29598 A | 2/1993 |
| JP | 2007-115803 A | 5/2007 |
| JP | 2008-004692 A | 1/2008 |
| JP | 2008-270500 A | 11/2008 |
| JP | 2009-105358 A | 5/2009 |
| JP | 2010-016128 A | 1/2010 |
| JP | 2010-206095 A | 9/2010 |

\* cited by examiner

*Primary Examiner* — Luan C Thai
(74) *Attorney, Agent, or Firm* — Canon USA, Inc. IP Division (57) ABSTRACT

A method for manufacturing a solid-state image pickup device that includes a pixel portion and a peripheral circuit portion, includes: forming a first insulating film in the pixel portion and the peripheral circuit portion, forming a second insulating film above the first insulating film, etching the second insulating film in photoelectric conversion elements, forming a metal film on the etched second insulating film in the photoelectric conversion elements and on the second insulating film in the peripheral circuit portion, and removing the metal film in the peripheral circuit portion and forming light-shielding films from the metal film in the photoelectric conversion elements.

18 Claims, 7 Drawing Sheets

METHOD FOR MANUFACTURING SOLID-STATE IMAGE PICKUP DEVICE

CROSS-REFERENCE TO RELATED APPLICATION

This application is a Continuation of U.S. application Ser. No. 13/473,433, filed May 16, 2012, which claims the benefit of Japanese Patent Application No. 2011-119259 filed May 27, 2011, which is hereby incorporated by reference herein in its entirety.

BACKGROUND OF THE INVENTION

1. Field of the Invention

One disclosed aspect of the embodiments relates to methods for manufacturing solid-state image pickup devices. More particularly, one disclosed aspect of the embodiments relates to a technique for forming a light-shielding film in a solid-state image pickup device including pixels having a light-shielding film.

2. Description of the Related Art

Regarding active-pixel solid-state image pickup devices such as complementary metal oxide semiconductor (CMOS) image sensors, configurations have been proposed in which a global electronic shutter function is implemented in pixels and in which pixels for focus detection are additionally included.

The global electronic shutter function refers to a function of starting and terminating accumulation of photoelectric charges at the same timings in a plurality of pixels arranged in a matrix form. In order to perform the global electronic shutter function, each pixel of a solid-state image pickup device has a photoelectric conversion element and a charge holding part that holds charges generated through photoelectric conversion for a predetermined period. In the solid-state image pickup device having the global electronic shutter function, each charge holding part holds charges for a period from when accumulation of photoelectric charges is terminated to when the charges are read out. If charges generated in parts other than the photoelectric conversion element flow into the charge holding part during this period, the charges may become a noise signal, and consequently degrade the image quality. To cope with such an undesirable charge inflow, Japanese Patent Laid-Open No. 2007-115803 discloses a configuration in which a second gate electrode of polysilicon is formed so as to be stacked above a first gate electrode and cover the charge holding part in order to block incident light. The second gate electrode described in Japanese Patent Laid-Open No. 2007-115803 prevents light from coming into the charge holding part and consequently suppresses generation of charges in parts other than the photoelectric conversion element, thereby suppressing image quality degradation.

In addition, Japanese Patent Laid-Open No. 2009-105358 discloses a configuration including focus detection pixels, each of which is provided with a light-shielding film having a slit.

With the recent increases in the number of pixels of solid-state image pickup devices and in the functionality of solid-state image pickup devices, there is a strong demand for enhanced functionality of transistors that are disposed in a peripheral circuit portion for controlling photoelectric conversion elements and reading out signals output from the photoelectric conversion elements. To enhance the functionality of the transistors, the widths of polysilicon electrodes that form gate electrodes and spaces therebetween have to be narrowed. The resulting narrow spaces between the electrodes have small (concave-shaped) hollows.

A method for forming the light-shielding gate electrodes described in Japanese Patent Laid-Open No. 2007-115803 includes patterning a polysilicon film by etching, thereby forming the gate electrodes. In the case where a polysilicon film is patterned, the polysilicon film may undesirably remain in narrow spaces between the gate electrodes of transistors arranged in the peripheral circuit portion. This remaining polysilicon film causes charge leakage and reduces yields. In order to improve the yields, the following method may be used. An insulating film disposed under the polysilicon film is thickened so as to make small concave-shaped hollows more gradual, thereby preventing the polysilicon film from remaining after etching. However, this method degrades the optical properties of the solid-state image pickup device because the distance between each photoelectric conversion element and a corresponding microlens disposed on the topmost surface increases. Such a drawback also occurs in another configuration described in Japanese Patent Laid-Open No. 2007-115803 in which the light-shielding film is formed of a non-polysilicon film, e.g., a metal film of tungsten, etc.

In addition, the same drawback may occur when a light-shielding film having a slit is formed in a solid-state image pickup device disclosed in Japanese Patent Laid-Open No. 2009-105358.

SUMMARY OF THE INVENTION

One disclosed aspect of the embodiments provides a manufacturing method which improves yields while maintaining the optical properties of a solid-state image pickup device having a light-shielding film.

According to an aspect of the present disclosure, there is provided a method for manufacturing a solid-state image pickup device including a pixel portion in which a plurality of pixels each including a photoelectric conversion element and a transistor are arranged, and a peripheral circuit portion in the vicinity of the pixel portion and including a transistor. The method includes: forming gate electrodes of the transistors in the pixel portion and the peripheral circuit portion; forming a first insulating film in the pixel portion and the peripheral circuit portion; forming a second insulating film above the first insulating film in the pixel portion and the peripheral circuit portion; etching the second insulating film in the photoelectric conversion elements; forming a metal film on the etched second insulating film in the photoelectric conversion elements and on the second insulating film in the peripheral circuit portion; and removing the metal film in the peripheral circuit portion, and forming light-shielding films from the metal film in the photoelectric conversion elements.

Further features of the disclosure will become apparent from the following description of exemplary embodiments with reference to the attached drawings.

BRIEF DESCRIPTION OF THE DRAWINGS

FIG. 6A is a circuit diagram of a pixel of a solid-state image pickup device according to a second embodiment, whereas

DESCRIPTION OF THE EMBODIMENTS

First Embodiment

Figure 1:
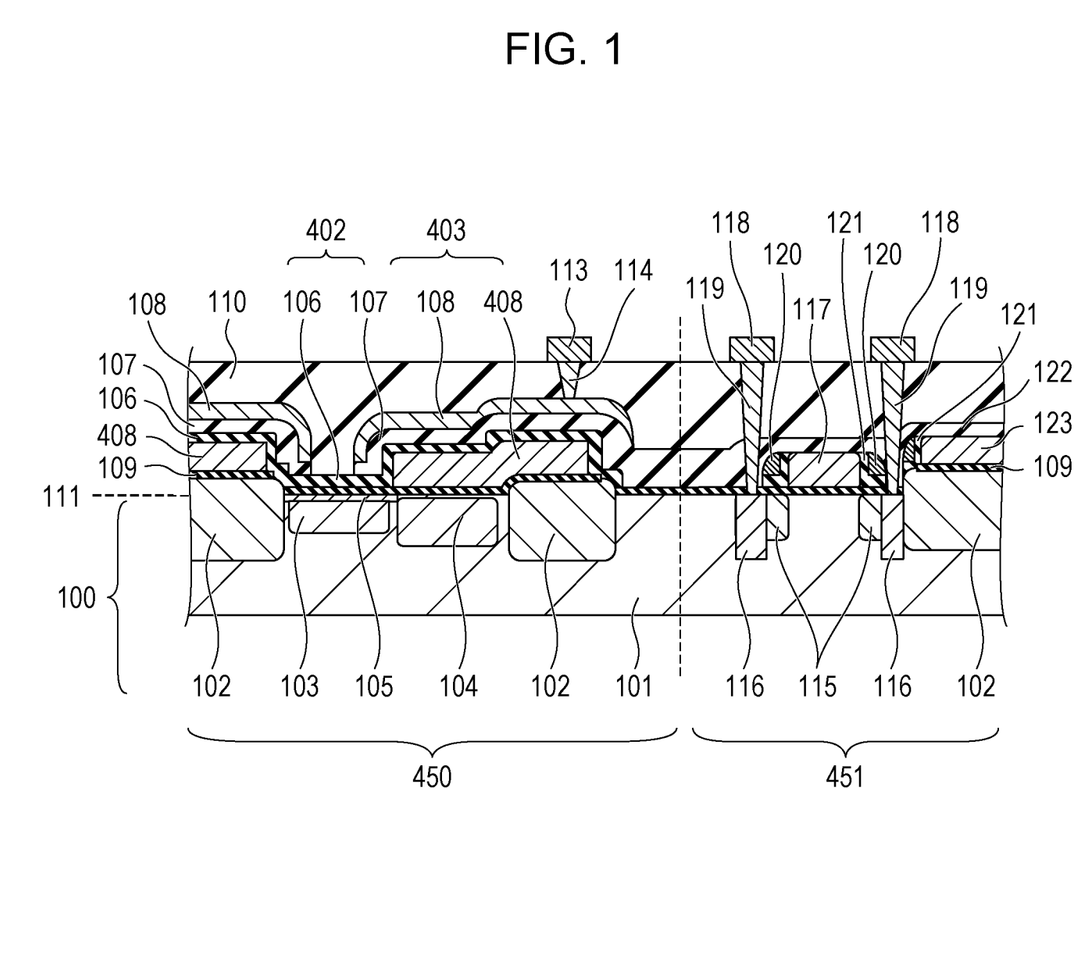
FIG. 1 is a schematic sectional view of a solid-state image pickup device according to a first embodiment.
Figure 4:
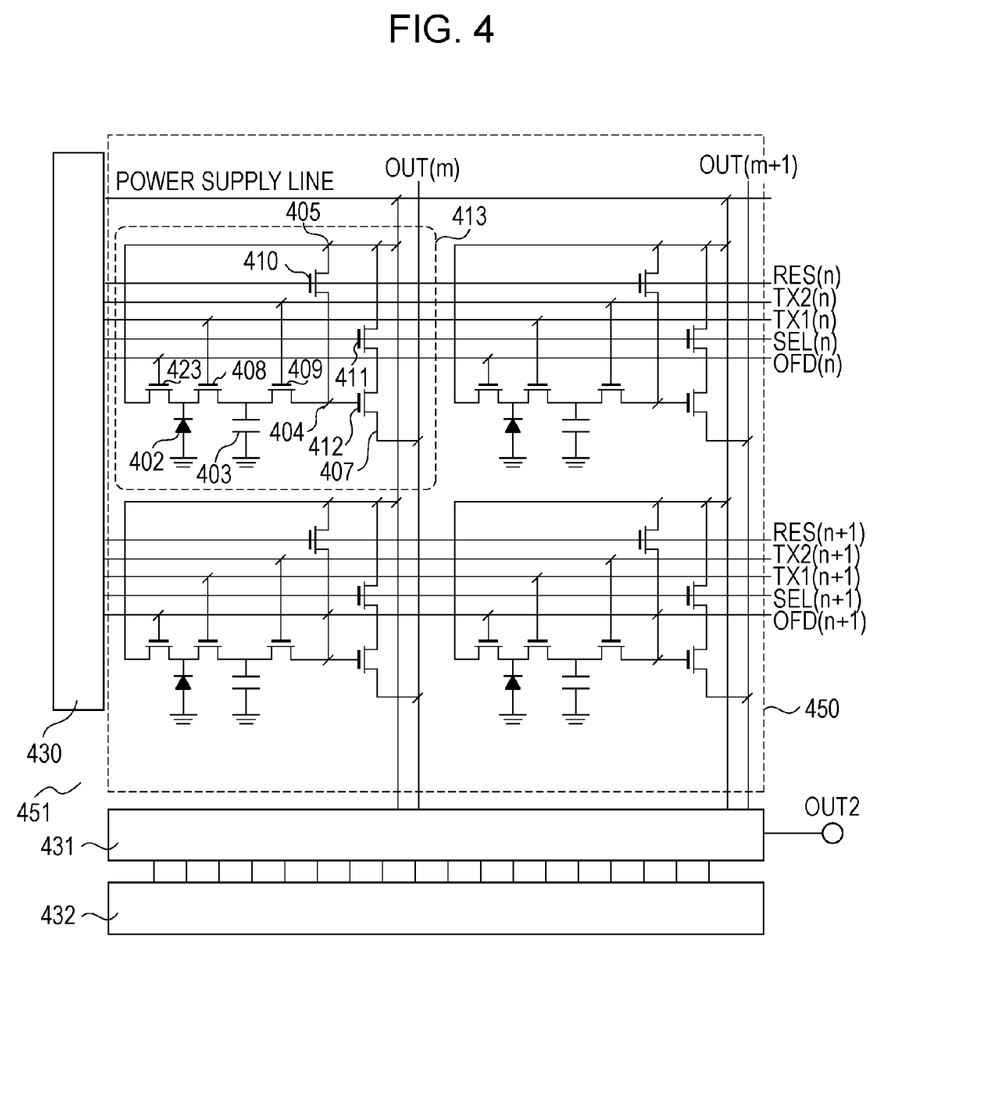
FIG. 4 is a circuit diagram of the solid-state image pickup device according to the first embodiment.
Figure 5:
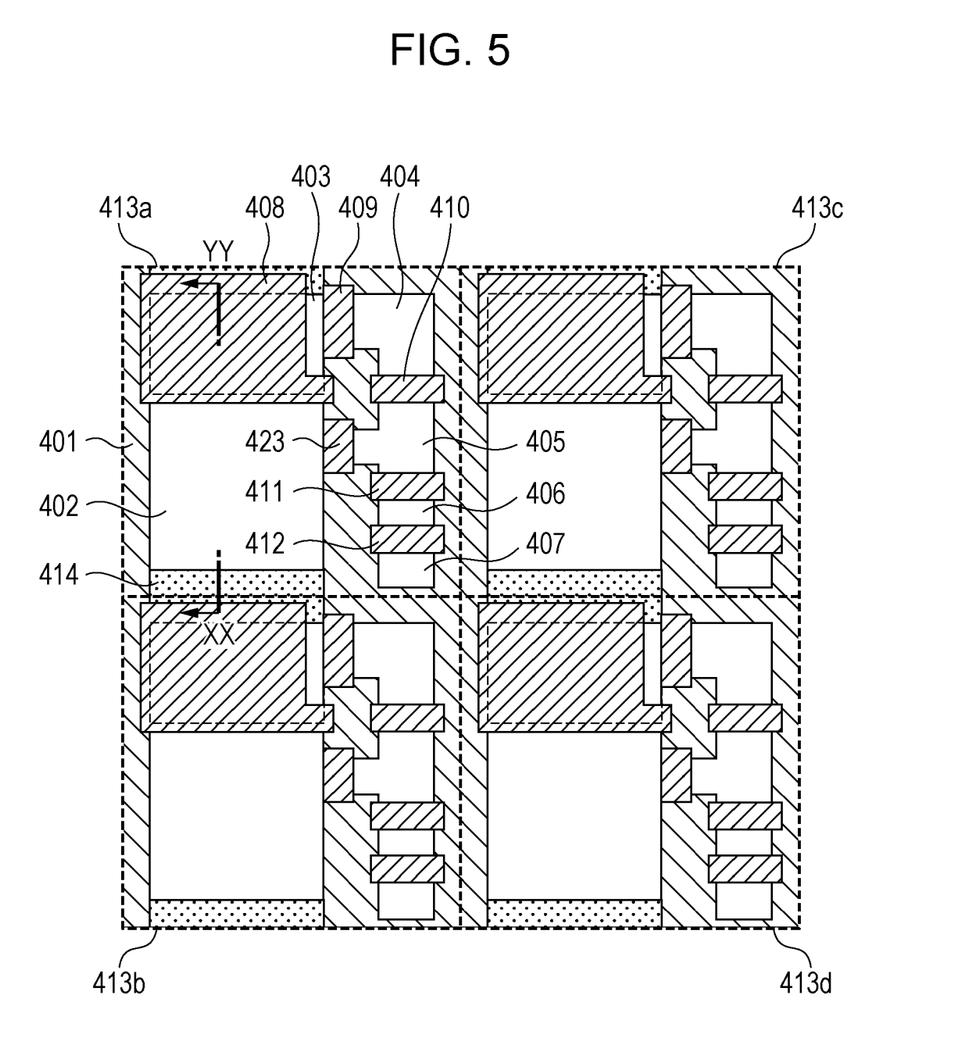
FIG. 5 is a schematic plan view of the solid-state image pickup device according to the first embodiment.

A solid-state image pickup device according to a first embodiment will be described using FIGS. 1, 4, and 5. FIG. 1 is a schematic sectional view of the solid-state image pickup device according to this embodiment. FIG. 4 illustrates a circuit diagram of four pixels included in the solid-state image pickup device according to this embodiment. FIG. 5 is a schematic plan view corresponding to FIG. 4.

First, the description will be given of FIG. 4 illustrating a circuit diagram of four pixels of the solid-state image pickup device according to this embodiment and FIG. 5 illustrating a schematic plan view that corresponds to FIG. 4. FIG. 4 illustrates a configuration in which pixels 413 each having a charge holding part are arranged in a 2×2 matrix form. In this embodiment, each pixel 413 includes a photoelectric conversion element 402, a charge holding part 403, a floating diffusion part 404, a power supply part 405, a pixel output part 407, a first gate electrode 408 of a first transfer transistor, and a second gate electrode 409 of a second transfer transistor. Each pixel 413 also includes a gate electrode 410 of a reset transistor, a gate electrode 411 of a selection transistor, a gate electrode 412 of an amplifying transistor, and a gate electrode 423 for an overflow drain (hereinafter, abbreviated as OFD) which serves as an ejection part. A power supply line is wiring that supplies a predetermined voltage and is connected to the power supply part 405. Here, the power supply part 405 serves as a node shared by a drain of the reset transistor, a drain of the selection transistor, and a drain of the OFD. Control lines RES, TX1, TX2, SEL, and OFD supply pulses to the corresponding gate electrodes. These control lines are supplied with pulses from a vertical scanning circuit 430. The control line RES supplies pulses to the gate electrode 410 of the reset transistor. The control line TX1 supplies pulses to the first gate electrode 408. The control line TX2 supplies pulses to the second gate electrode 409. The control line SEL supplies pulses to the gate electrode 411 of the selection transistor. The control line OFD supplies pulses to the gate electrode 423 for the OFD. Signals are output to a signal line OUT. "n" and "n+1" represent a specific row and a row next to the specific row, respectively, where "n" is a natural number. Similarly, "m" and "m+1" represent a specific column and a column next to the specific column, respectively, where "m" is a natural number. Signals output from the signal line OUT are held in a readout circuit 431, in which processing such as amplification and addition may be performed. The signals are then output to outside of the solid-state image pickup device from the readout circuit 431 via a terminal OUT2. At this time, control signals for controlling the processing such as addition of signals and controlling output of the signals to the terminal OUT2 are supplied to the readout circuit 431 from a horizontal scanning circuit 432. A region where the pixels 413 are arranged is referred to as a pixel portion 450, whereas a region where the scanning circuits 430 and 432 and the readout circuit 431 are arranged in the vicinity of the pixel portion 450 is referred to as a peripheral circuit portion 451. Meanwhile, the pixel 413 is a configuration including one photoelectric conversion element 402, and serves as the minimum repetition unit in a configuration of a photoelectric conversion device. A region where the plurality of pixels 413 are arranged is referred to as an image pickup region.

An operation of the global shutter in such a pixel 413 is performed in the following manner. After elapse of a certain accumulation period, signal charges generated in the photoelectric conversion element 402 is transferred to the charge holding part 403 via the first gate electrode 408. While the charge holding part 403 is holding the signal charges having been generated during the certain accumulation period, the photoelectric conversion element 402 starts accumulating signal charges again. The signal charges held in the charge holding part 403 are transferred to the floating diffusion part 404 via the second gate electrode 409, and are output as a signal from the pixel output part 407 of the amplifying transistor. In order to prevent charges that are generated in the photoelectric conversion element 402 while the charge holding part 403 is holding the signal charges from flowing into the charge holding part 403, the charges in the photoelectric conversion element 402 may be ejected via the OFD. Before the signal charges are transferred to the floating diffusion part 404 from the charge holding part 403, the reset transistor sets a potential of the floating diffusion part 404 to a predetermined level (reset operation). At this time, the potential of the floating diffusion part 404 is output as a noise signal from the pixel output part 407. By subtracting the noise signal from a to-be-output signal that is based on the signal charges, the noise signal may be removed.

FIG. 5 is a schematic plan view of the solid-state image pickup device illustrated in FIG. 4. The pixels 413, i.e., a first pixel 413a, a second pixel 413b, a third pixel 413c, and a fourth pixel 413d, are arranged in a 2×2 matrix form. Components having the same functions as the corresponding components in FIG. 4 are assigned the same references to omit the description. The references XXXa, XXXb, XXXc, and XXXd indicate that components assigned these references are of the first pixel 413a, the second pixel 413b, the third pixel 413c, and the fourth pixel 413d, respectively. Additionally, for ease of explanation, contacts and wiring other than the gate electrodes are omitted. The parts sharing a node in FIG. 4 may be the same semiconductor region or may be connected via wiring. The configuration of a pixel will be described by focusing on the first pixel 413a illustrated in FIG. 5. The first gate electrode 408a extends above the charge holding part 403a. By disposing the first gate electrode 408a to extend above the charge holding part 403a, an amount of light coming into the charge holding part 403a may be reduced. In addition, by controlling a voltage supplied to the first gate electrode 408a, dark current may be decreased in the charge holding part 403a. Meanwhile, element isolation parts 401 and 414 are also illustrated.

FIG. 1 illustrates a schematic sectional view of the pixel portion 450 taken along line XX-YY illustrated in FIG. 5 and of a given transistor in the peripheral circuit portion 451 of the solid-state image pickup device according to this embodiment. Here, a case will be described where electrons serve as signal charges. Referring to FIG. 1, a semiconductor substrate 100 includes a well 101 and element isolation parts 102. In the pixel portion 450, an n-type semiconductor region 103 that constitutes the photoelectric conversion element 402 and an n-type semiconductor region 104 that constitutes the charge holding part 403 are disposed in the well 101. On the n-type semiconductor region 103, a p-type semiconductor region 105 is disposed which constitutes the photoelectric conversion element 402 and may function as a surface protection layer. In the charge holding part 403, the first gate electrode 408 is disposed which is the gate electrode of the first transfer transistor for controlling transfer of charges from the semiconductor region 103 to the semiconductor region 104. The first gate electrode 408 is disposed above the semiconductor region 104 so as to extend from a position above and between the semiconductor regions 103 and 104 to a position above the element isolation part 102. On the first gate electrode 408 and above the photoelectric conversion element 402, a first insulating film 106 is disposed. On the first insulating film 106, a second insulating film 107 is disposed which has an opening corresponding to the photoelectric conversion element 402. Between the first insulating film 106 and the well 101, a gate insulating film 109 is disposed. The gate insulating film 109 is disposed on a principal surface 111 of the semiconductor substrate 100 in a region where the photoelectric conversion element 402 and the first gate electrode 408 are disposed. Referring to FIG. 1, on the second insulating film 107, a light-shielding film 108 is disposed which has an opening that corresponds to a light-receiving surface of the photoelectric conversion element 402. The light-shielding film 108 is covered with an interlayer insulating film 110. In the interlayer insulating film 110, a plug 114 is disposed which supplies a potential to the light-shielding film 108. On the interlayer insulating film 110, wiring 113 connected to the plug 114 is disposed. The wiring 113 is included in a wiring layer which is disposed at the bottommost layer (closest to the principal surface 111 of the semiconductor substrate 100) of a multilayer wiring structure. That is, the light-shielding film 108 is disposed closer to the semiconductor substrate 100 than the bottommost wiring layer in this embodiment. A plug and wiring (not illustrated) for supplying a control signal to the first gate electrode 408 may be additionally disposed. The light-receiving surface of the photoelectric conversion element 402 may be included in the principal surface 111 of the semiconductor substrate 100.

In the peripheral circuit portion 451 illustrated in FIG. 1, a given transistor constituting the scanning circuit 430 or 432, or the readout circuit 431 in the peripheral circuit portion 451 is disposed in the well 101. The transistor has a lightly doped drain (LDD) structure. Specifically, the transistor has source and drain regions each of which is constituted by an n-type semiconductor region 116 and an n-type semiconductor region 115 having an impurity concentration lower than that of the semiconductor region 116. The transistor also includes a gate electrode 117 which is disposed between the source region and the drain region above the principal surface 111 of the semiconductor substrate 100 via the gate insulating film 109. Next to the gate electrode 117 of the transistor, side walls 120 are disposed with insulating films 121 disposed therebetween. In the peripheral circuit portion 451, the transistor is covered with an insulating film 122, which is covered with the interlayer insulating film 110. In the interlayer insulating film 110, plugs 119 for connecting the source region to the drain region are disposed. On the interlayer insulating film 110, wiring 118 connected to the plugs 119 is disposed. The peripheral circuit portion 451 illustrated in FIG. 1 further includes a plug and wiring (not illustrated) for supplying a control signal to the gate electrode 117. Furthermore, components such as wiring, color filters, and microlenses (not illustrated) are appropriately arranged above the pixel portion 450 and the peripheral circuit portion 451 illustrated in FIG. 1. Here, a gate electrode 123 is a part of a gate electrode of another transistor. The gate electrode 123 and the gate electrode 117 are arranged with a narrow space therebetween.

A method for manufacturing the solid-state image pickup device according to this embodiment illustrated in FIG. 1 will be described using FIGS. 2A to 3C. FIGS. 2A to 3C are schematic sectional views corresponding to steps of the method for manufacturing the solid-state image pickup device illustrated in FIG. 1. In FIGS. 2A to 3C, components that are the same as those illustrated in FIG. 1 are assigned the same references to omit the description.

Figure 2A:
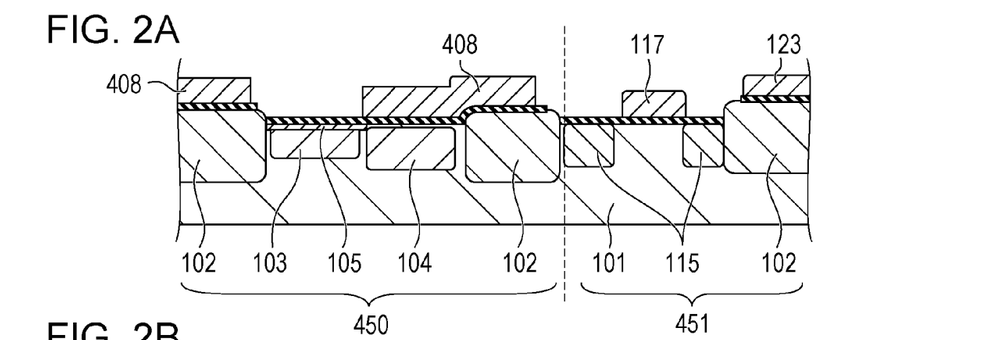
FIGS. 2A to 2D are schematic sectional views illustrating a process of manufacturing the solid-state image pickup device according to the first embodiment.

As illustrated in FIG. 2A, the element isolation parts 102 are formed in the semiconductor substrate 100 by using shallow trench isolation (STI) or local oxidation of silicon (LOCOS). Then, the well 101 is formed by ion implantation. The well 101 in the pixel portion 450 and the well 101 in the peripheral circuit portion 451 may have different configurations. Thereafter, the n-type semiconductor region 104 constituting the charge holding part 403 of the pixel portion 450, and the n-type semiconductor region 103 and the p-type semiconductor region 105 constituting the photoelectric conversion element 402, and so forth are sequentially formed in the well 101. The gate insulating film 109 is then formed. Subsequently, polysilicon is deposited, and the first gate electrode 408 and the gate electrode 117 of the transistors are formed in the pixel portion 450 and the peripheral circuit portion 451, respectively, by using the photolithography and etching techniques. Then, the n-type semiconductor regions 115 constituting the source and drain regions of the transistor in the peripheral circuit portion 451 are formed by ion implantation. Meanwhile, the n-type semiconductor region 103 constituting the photoelectric conversion element 402 may be formed in a self-aligned manner by forming the first gate electrode 408 and then performing ion implantation using the first gate electrode 408.

Figure 2B:
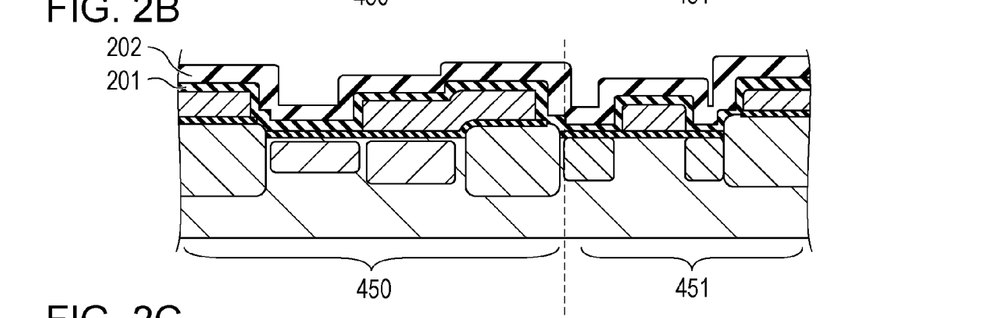

Thereafter, the first insulating film 201 made of a silicon nitride film and the third insulating film 202 made of a silicon dioxide film are formed to be stacked one another by chemical vapor deposition (CVD) (FIG. 2B). Here, the first insulating film 201 in the photoelectric conversion element 402 constitutes the insulating film 106. The first insulating film 201 may function as an etching stop film or an antireflection coating film in the pixel portion 450.

Figure 2C:
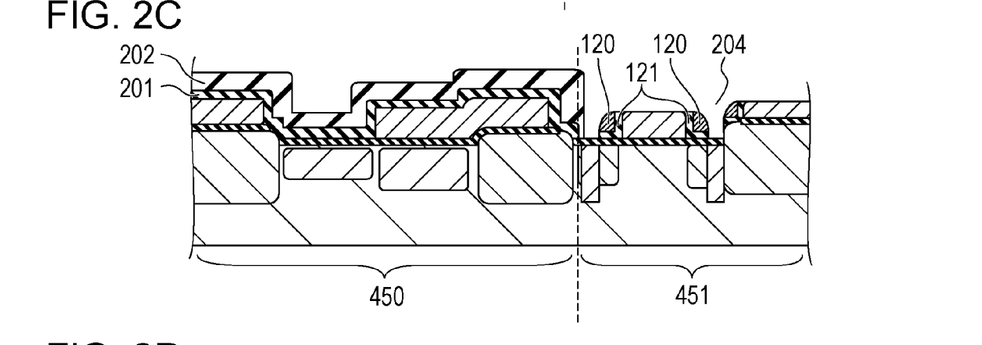

As illustrated in FIG. 2C, etching is performed to remove the first insulating film 201 and the third insulating film 202 in the peripheral circuit portion 451 from the configuration illustrated in FIG. 2B. As a result of this etching step, the side walls 120 are formed on the respective sides of the gate electrode 117 made of polysilicon in the peripheral circuit portion 451. The side walls 120 are formed from the third insulating film 202. The first insulating film 201 partially remains between the gate electrode 117 and each side wall 120 and on the gate electrode 117, whereby the insulating film 121 is formed. That is, in this step, the insulating film 106 and the insulating film 121 are formed in the pixel portion 450 and the peripheral circuit portion 451, respectively. Regions where the source and drain regions are to be formed are exposed on the principal surface 111 of the semiconductor substrate 100. Ion implantation is performed on these exposed regions where the source and drain regions are to be formed, whereby the semiconductor regions 116 are formed which have an impurity concentration higher than that of the semiconductor regions 115. In this manner, the source and drain regions are formed.

Figure 2D:
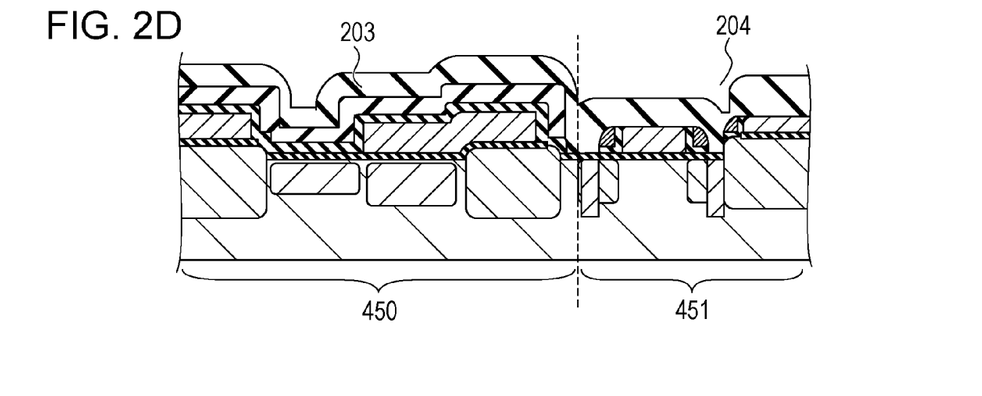

Subsequently, as illustrated in FIG. 2D, a second insulating film 203 made of a silicon dioxide film is formed in a thickness of approximately 200 nm by using CVD or the like. This second insulating film 203 enables a metal film to be formed and patterned desirably in the following steps. Specifically, a small concave-shaped part 204 between the polysilicon gate electrodes in the peripheral circuit portion 451 is filled with the second insulating film 203. With this method, in etching for patterning a metal film, the metal film is less likely to remain at the small concave-shaped part in the following steps. Additionally, since the second insulating film 203 is disposed above the gate electrode 117 of the transistor, the transistor is protected when the metal film is etched.

Figure 3A:
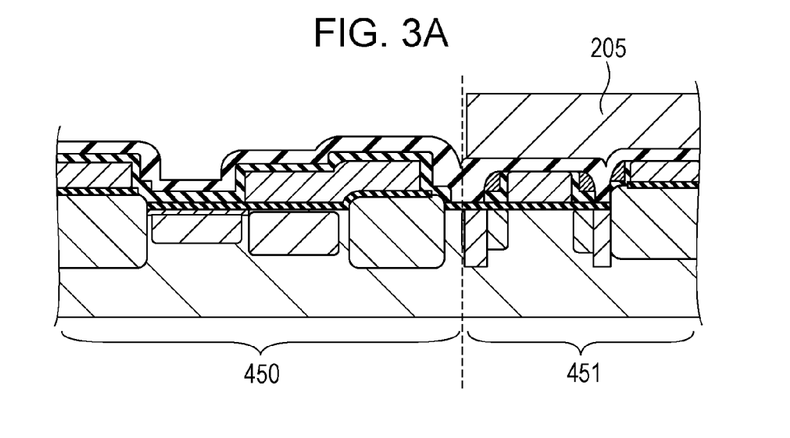
FIGS. 3A to 3C are schematic sectional views illustrating the process of manufacturing the solid-state image pickup device according to the first embodiment.

Thereafter, as illustrated in FIG. 3A, a photoresist mask 205 is disposed in the peripheral circuit portion 451 and etching is performed in the pixel portion 450 using the photolithography and etching techniques. As a result of this step, the third insulating film 202 and the second insulating film 203 are partially etched in the pixel portion 450, whereby the insulating film 107 is formed. The insulating film 122 is also formed from the second insulating film 203 in the peripheral circuit portion 451. Here, the insulating film 107 is etched so as to be thinner than the insulating film 122. By obtaining the insulating film 107 having such a thickness, an optical path length, for example, from a microlens to the light-receiving surface of the photoelectric conversion element 402 in the pixel portion 450, may be shortened, and consequently the optical properties may be improved. In addition, the distance from the light-receiving surface of the photoelectric conversion element 402 to the bottom end of the light-shielding film may be decreased in the pixel portion 405, and thus leakage of light into the charge holding part 403 may be suppressed. Meanwhile, in the pixel portion 450, a gradual surface is obtained by forming the second insulating film 203. Then, by etching the gradual surface, a gradual surface of the etched second insulating film 203 may be obtained. Accordingly, unnecessary remainders of the etched metal film may be decreased. The photoresist mask 205 in the peripheral circuit portion 451 is then removed.

Figure 3B:
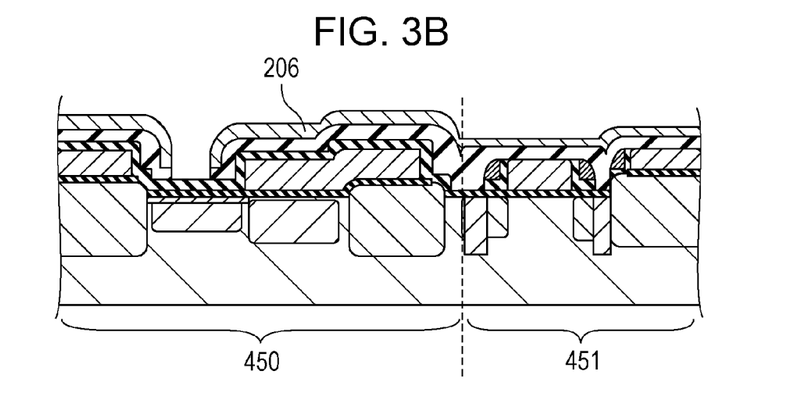

Subsequently, as illustrated in FIG. 3B, a metal film 206 of tungsten, tungsten silicide, or the like is formed by using physical vapor deposition (PVD) or CVD.

Figure 3C:
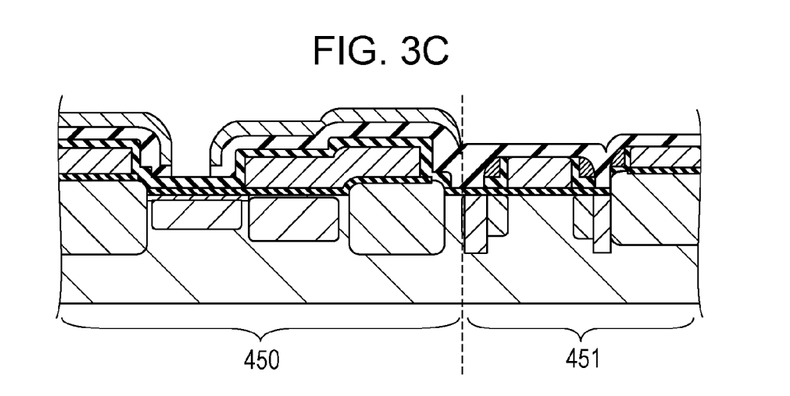

Referring to FIG. 3C, the metal film 206 disposed in a region where the light-shielding film is not needed is removed by using the photolithography and etching techniques, whereby the light-shielding film 108 is formed. The region where the light-shielding film is not needed includes, for example, the light-receiving surface of the photoelectric conversion element 402, a plug formation part (not illustrated) for the first gate electrode 408 of the charge holding part 403, and the peripheral circuit portion 451. During the removal, the first insulating film 106 above the photoelectric conversion element 402 may function as an etching stop film. In addition, since the insulating film 122 that is thicker than the insulating film 107 disposed in the pixel portion 450 is disposed in the peripheral circuit portion 451, damages of etching to the transistor or the like may be decreased. The bottom end of the light-shielding film 108 is adjustable by thicknesses of the gate insulating film 109, the insulating film 106, and the insulating film 107. However, in consideration of the withstand voltage of the transistor and the damage to the photoelectric conversion element 402, the thickness of the insulating film 107 is preferably adjusted.

Lastly, a silicon dioxide film or a silicon dioxide film doped with boron or phosphorus is formed, whereby the interlayer insulating film 110 is formed. In the interlayer insulating film 110, the plugs 114 and 119 are formed of tungsten or the like, and the wiring 113 and the wiring 118 are formed of aluminum or copper on the plugs 114 and 119, whereby the configuration illustrated in FIG. 1 may be obtained. Subsequently, wiring, color filters, and microlenses (not illustrated in FIG. 1) are further formed. In this manner, the solid-state image pickup device is completed.

As described above, the manufacturing method according to this embodiment may decrease remainders of the light-shielding film while maintaining the optical properties, and consequently improve yields. Additionally, elements in the peripheral circuit portion may be protected from etching damages when the light-shielding film is formed. Moreover, the photoelectric conversion element of the pixel portion may be protected from etching damages when the light-shielding film is formed.

Meanwhile, the third insulating film 202 used in the manufacturing method according to this embodiment may be omitted when the transistor in the peripheral circuit portion 451 is not formed in the LDD structure. Even when the transistor in the peripheral circuit portion 451 is formed in the LDD structure, the side walls may be formed by adjusting the thickness of the first insulating film 201, and thus the third insulating film 202 may be omitted. When the third insulating film 202 is omitted, the optical path length may be shortened by making the second insulating film 203 in the pixel portion 450 thinner than the second insulating film 203 in the peripheral circuit portion 451, and consequently the optical properties may be improved.

Second Embodiment

As in the first embodiment, a solid-state image pickup device according to a second embodiment relates a solid-state image pickup device having light-shielding films. Unlike the first embodiment, the solid-state image pickup device according to this embodiment relates to a solid-state image pickup device having pixels for acquiring image signals and pixels for acquiring focus detection signals in the pixel portion 450. The solid-state image pickup device according to this embodiment will be described using FIGS. 6A to 7.

Figure 6A:
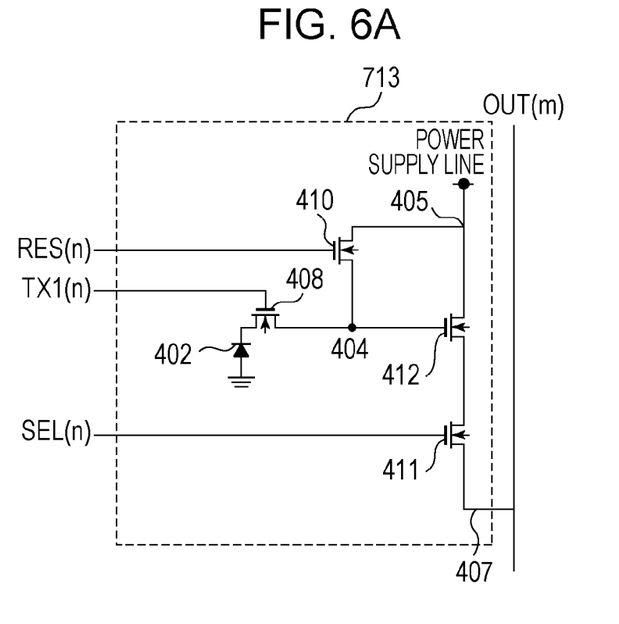
Figure 6B:
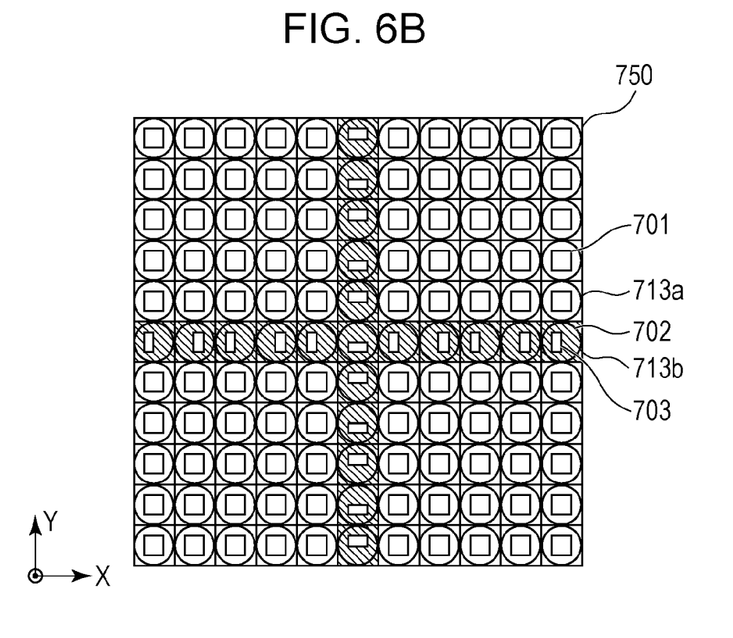
FIG. 6B is a schematic plan view of the pixels of the solid-state image pickup device according to the second embodiment.

FIG. 6A illustrates a circuit diagram of a pixel 713 of the solid-state image pickup device according to this embodiment. In this embodiment, the pixel 413 of the solid-state image pickup device according to the first embodiment illustrated in FIG. 4 is replaced with the pixel 713 illustrated in FIG. 6A. The pixel 713 illustrated in FIG. 6A has a circuitry of a general CMOS solid-state image pickup device. Specifically, the pixel 713 includes a photoelectric conversion element 402, a floating diffusion part 404, a power supply part 405, a pixel output part 407, and a first gate electrode 408 of a first transfer transistor. The pixel 713 illustrated in FIG. 6A also includes a gate electrode 410 of a reset transistor, a gate electrode 411 of a selection transistor, and a gate electrode 412 of an amplifying transistor. A power supply line is wiring for supplying a predetermined voltage, and is connected to the power supply part 405. Here, the power supply part 405 is a node shared by a drain of the reset transistor and a drain of the selection transistor. Control lines RES, TX1, and SEL supply pulses to the corresponding gate electrodes. The pulses are supplied from the vertical scanning circuit 430 illustrated in FIG. 4. A signal is output to a signal line OUT. The description regarding driving and so forth is omitted here.

FIG. 6B illustrates a pixel portion 750 of the solid-state image pickup device according to this embodiment. In this embodiment, the pixel portion 450 illustrated in FIG. 4 is replaced with the pixel portion 750 illustrated in FIG. 6B. In the pixel portion 750, the plurality of pixels 713 each illustrated in FIG. 6A are arranged along a direction X and a direction Y that is perpendicular to the direction X. The plurality of pixels 713 arranged in the pixel portion 750 include pixels 713a for acquiring image signals and pixels 713b for acquiring focus detection signals. A difference between the pixels 713a and the pixels 713b is that the pixels 713a are not provided with light-shielding films whereas the pixels 713b are provided with light-shielding films each having an opening (slit) that is shifted with respect to the photoelectric conversion element 402. Referring to FIG. 6B, each of the pixels 713a and 713b is provided with a microlens 701. The pixels 713b are provided with the light-shielding films 702. Each light-shielding film 702 has an opening 703, which has the centroid that is different from the centroid of the corresponding photoelectric conversion element 402, depending on the position of the pixel 713b in the pixel portion 750. With such a configuration, pupil segmentation is performed in the pixels 713b, whereby focus detection signals may be obtained.

Figure 7:
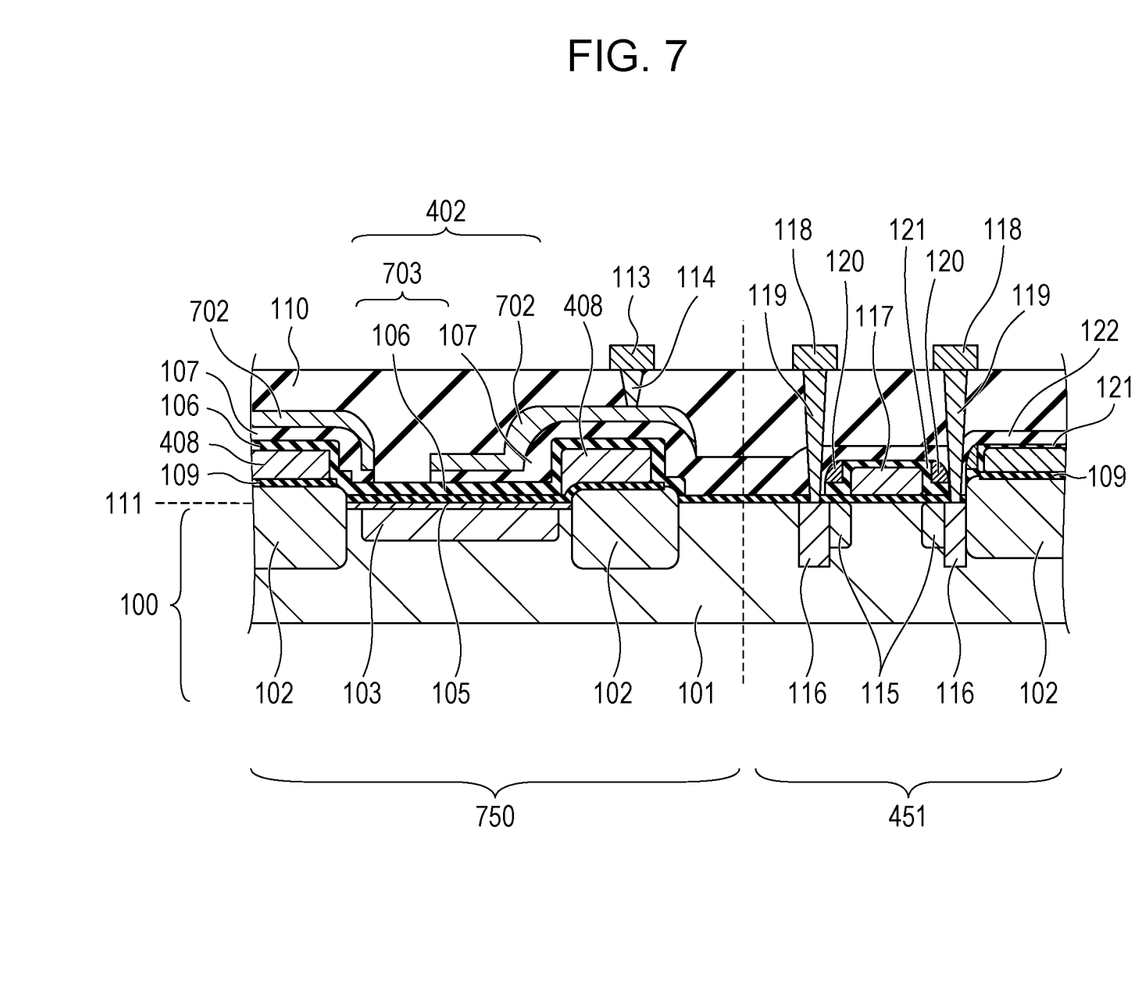
FIG. 7 is a schematic sectional view of the solid-state image pickup device according to the second embodiment.

FIG. 7 is a schematic sectional view of the photoelectric conversion element 402 of the pixel 713b and corresponds to FIG. 1 according to the first embodiment. In FIG. 7, components that are the same as those illustrated in FIG. 1 are assigned the same references to omit the description. A difference between this embodiment and the first embodiment is the light-shielding film 702, which corresponds to the light-shielding film 108 in the first embodiment. The light-shielding film 702 extends above the light-receiving surface of the photoelectric conversion element 402 in the pixel portion 750 and has the opening 703. As in the first embodiment, the insulating film 107 extends above the light-receiving surface of the photoelectric conversion element 402 along with the light-shielding film 702. The manufacturing method according to this embodiment is the same as the manufacturing method according to the first embodiment except that a mask used for patterning a metal film when the light-shielding film 108 is formed in the first embodiment differs from that used in the second embodiment. That is, the manufacturing method according to the first embodiment is applicable to the solid-state image pickup device according to this embodiment which includes pixels for acquiring image signals and pixels for acquiring focus detection signals. Accordingly, in this embodiment, the manufacturing method may be provided which improves yields while maintaining the optical properties of the solid-state image pickup device. Additionally, the light-shielding film 702 is disposed closer to the semiconductor substrate 100 than the bottommost wiring layer (wiring 113) in this embodiment. By disposing the light-shielding film 702 at such a position, stray light may be decreased and consequently high-quality focus detection signals may be acquired.

In this embodiment, the circuit illustrated in FIG. 6A is adopted in the pixel 713. However, the circuit of the pixel 713 is not limited to this particular example and may be a circuit having a charge holding part illustrated in the first embodiment, for example.

As an application example of the solid-state image pickup device according to each of the above embodiments, an image capturing system into which the solid-state image pickup device is incorporated will be illustratively described below. The concept of the image capturing system includes not only apparatuses mainly for image capturing, such as still cameras and camcorders, but also apparatuses additionally having the image capturing function, e.g., personal computers and mobile terminals. The image capturing system includes the solid-state image pickup device according to each of the above embodiments, and a processing unit configured to process signals output from the solid-state image pickup device. The processing unit may include, for example, a processor for processing digital data. In the case where the solid-state image pickup device outputs a focus detection signal, the image capturing system may further include a focus detection processing unit. The focus of an optical system may be adjusted on the basis of a signal supplied from the focus detection processing unit. In this manner, the solid-state image pickup device according to each embodiment is applied to an image capturing system. By using the solid-state image pickup devices according to the embodiments which have high light-shielding performance, stray light may be suppressed, whereby the precision of acquired image signals or focus detection signals improves. Since the precision of the acquired signals improves, image processing is performed more easily in a signal processing circuit. As a result, components such as the signal processing unit of the image capturing system may be simplified.

As described above, a manufacturing method that improves yields while maintaining the optical properties of a solid-state image pickup device having a light-shielding film may be provided by the methods for manufacturing a solid-state image pickup device according to the embodiments of the disclosure.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. A solid-state image pickup device having a pixel portion in which a photoelectric conversion unit and a charge holding unit are arranged, and having a peripheral circuit portion in the vicinity of the pixel portion and including a transistor, the image pickup device comprising:
a first insulating film provided on the charge holding unit and the transistor;
a light-shielding film provided on the first insulating film which is provided on the charge holding unit;
wherein a thickness of the first insulating film provided on the charge holding unit is smaller than a thickness of the first insulating film provided on the transistor.

2. The solid-state image pickup device according to claim 1, wherein the first insulating film extends over the pixel portion and the peripheral circuit portion.

3. The solid-state image pickup device according to claim 1, wherein the first insulating film is a silicon oxide film.

4. The solid-state image pickup device according to claim 1, further comprising a second insulating film provided under the first insulating film.

5. The solid-state image pickup device according to claim 4, wherein the second insulating film is a stack of films and the first insulating film is a single film.

6. The solid-state image pickup device according to claim 5, wherein the first insulating film is a silicon oxide film and the second insulating film comprises a silicon oxide film and a silicon nitride film.

7. The solid-state image pickup device according to claim 1, further comprising a side wall of the transistor, the side wall being provided between the first insulating film and a gate electrode of the transistor.

8. The solid-state image pickup device according to claim 1, wherein the light-shielding film is made of tungsten or tungsten silicide.

9. An image pickup system comprising:
the solid-state image pickup device according to claim 1; and
a processing unit configured to process signals from the solid-state image pickup device.

10. A solid-state image pickup device having a pixel portion in which a photoelectric conversion unit for focus detection is arranged, and having a peripheral circuit portion in the vicinity of the pixel portion and including a transistor, the image pickup device comprising:
- a first insulating film provided on the photoelectric conversion unit and the transistor; and
- a light-shielding film having a slit and provided on the first insulating film which is provided on the photoelectric conversion unit,
- wherein a thickness of the first insulating film provided on the photoelectric conversion unit is smaller than a thickness of the first insulating film provided on the transistor.

11. The solid-state image pickup device according to claim 10, wherein the first insulating film extends over the pixel portion and the peripheral circuit portion.

12. The solid-state image pickup device according to claim 10, wherein the first insulating film is a silicon oxide film.

13. The solid-state image pickup device according to claim 10, further comprising a second insulating film provided under the first insulating film.

14. The solid-state image pickup device according to claim 13, wherein the second insulating film is a stack of films and the first insulating film is a single film.

15. The solid-state image pickup device according to claim 14, wherein the first insulating film is a silicon oxide film and the second insulating film comprises a silicon oxide film and a silicon nitride film.

16. The solid-state image pickup device according to claim 10, further comprising a side wall of the transistor, the side wall being provided between the first insulating film and a gate electrode of the transistor.

17. The solid-state image pickup device according to claim 10, wherein the light-shielding film is made of tungsten or tungsten silicide.

18. An image pickup system comprising:
- the solid-state image pickup device according to claim 10; and
- a processing unit configured to process signals from the solid-state image pickup device.

* * * * *